(12) United States Patent
Zhao et al.

(10) Patent No.: US 9,922,611 B2
(45) Date of Patent: Mar. 20, 2018

(54) GOA CIRCUIT FOR NARROW BORDER LCD PANEL

(71) Applicant: Wuhan China Star Optoelectronics Technology Co., Ltd., Wuhan (CN)

(72) Inventors: Mang Zhao, Wuhan (CN); Yao Yan, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 273 days.

(21) Appl. No.: 14/915,892

(22) PCT Filed: Jan. 28, 2016

(86) PCT No.: PCT/CN2016/072426
§ 371 (c)(1),
(2) Date: Mar. 1, 2016

(87) PCT Pub. No.: WO2017/107285
PCT Pub. Date: Jun. 29, 2017

(65) Prior Publication Data
US 2018/0047759 A1 Feb. 15, 2018

(30) Foreign Application Priority Data
Dec. 22, 2015 (CN) .......................... 2015 1 0989189

(51) Int. Cl.
*G09G 3/36* (2006.01)
*H01L 27/12* (2006.01)
(Continued)

(52) U.S. Cl.
CPC ......... *G09G 3/3674* (2013.01); *G02F 1/1333* (2013.01); *G02F 1/1362* (2013.01);
(Continued)

(58) Field of Classification Search
CPC ... G09G 2300/0408; G09G 2310/0286; G09G 2310/08; G09G 2310/0216; G09G 3/3266;
(Continued)

(56) References Cited

U.S. PATENT DOCUMENTS 9,035,865 B2 * 5/2015 Pak ...................... G09G 3/3677
345/100
9,830,845 B2 * 11/2017 Lim .......................... G09G 3/20
(Continued)

*Primary Examiner* — Sanjiv D Patel
(74) *Attorney, Agent, or Firm* — Leong C. Lei

(57) ABSTRACT

The invention provides a GOA circuit for narrow border LCD panel, by disposing a first node leakage prevention unit (700) comprised of ninth TFT (T9), tenth TFT (T10) and third capacitor (C3), wherein the ninth TFT (T9) has gate and source connected to the output clock signal (CK) to form a diode structure to charge the third capacitor (C3) and fourth node (H(n)) to high voltage; the tenth TFT (T10) clears the fourth node during stage-propagated signal duration to ensure normal charging for the first node (Q(n)). The GOA circuit is applicable to dual-side progressive scanning architecture and also to dual-side interlaced scanning architecture, and able to prevent current leakage in the first node under dual-side interlaced scanning architecture to ensure stable operation of circuit and improve reliability of GOA circuit. Moreover, with only two clock signals on each side, the invention is suitable for narrow border display panel.

13 Claims, 15 Drawing Sheets

(51) Int. Cl.
*G02F 1/1333* (2006.01)
*H01L 29/786* (2006.01)
*G02F 1/1362* (2006.01)
*G11C 19/18* (2006.01)

(52) U.S. Cl.
CPC ...... *H01L 27/1222* (2013.01); *H01L 27/1237* (2013.01); *H01L 29/78651* (2013.01); *G09G 2310/0286* (2013.01); *G11C 19/184* (2013.01)

(58) Field of Classification Search
CPC ....... G09G 3/3674–3/368; G11C 19/28; G11C 7/12; G11C 19/00; G11C 19/184; G11C 11/4085; G11C 19/287; G11C 27/04; G02F 1/13454
See application file for complete search history.

(56) References Cited

U.S. PATENT DOCUMENTS

| | | | |
|---|---|---|---|
| 9,865,187 B2* | 1/2018 | Wen | G09G 3/003 |
| 2004/0227718 A1* | 11/2004 | Park | G09G 3/3677 345/100 |
| 2009/0310734 A1* | 12/2009 | Umezaki | G11C 19/184 377/64 |
| 2011/0157145 A1* | 6/2011 | Toyoshima | G09G 3/3611 345/212 |
| 2014/0043304 A1* | 2/2014 | Yamashita | G11C 19/184 345/204 |
| 2014/0204009 A1* | 7/2014 | Kim | G09G 3/3677 345/92 |

* cited by examiner

GOA CIRCUIT FOR NARROW BORDER LCD PANEL

BACKGROUND OF THE INVENTION

1. Field of the Invention

The present invention relates to the field of display, and in particular to a gate driver on array (GOA) circuit for narrow border liquid crystal display (LCD) panel.

2. The Related Arts

The liquid crystal display (LCD) has the advantages of thin, energy-saving, radiation-free, and is widely applied to, such as, liquid crystal (LC) TV, mobile phone, personal digital assistant (PDA), digital camera, computer monitor or notebook computer monitor, and dominates the tablet display market.

The gate driver on array (GOA) technology is the array substrate column drive technology, by using the LCD array process to manufacture the gate scan driver circuit in the peripheral of the active area on the substrate to replace the external integrated circuit (IC) to accomplish horizontal scan line driving. The GOA technology reduces the bonding process of external IC and has the potential to improve yield rate and reduce cost, as well as the ability to realize narrow-border or border-less panels.

With the development of the low temperature poly-silicon (LTPS) semiconductor TFT, LTPS thin film transistor (TFT) LCD (TFT-LCD) attracts much attention. LPTS TFT-LCD has the advantages of high resolution, fast response, high luminance and high aperture ratio. Because LTPS silicon crystal is more orderly arranged than non-crystal silicon (a-Si), LTPS semiconductor shows an ultra-high carrier migration rate, which is 100 times higher than a-Si semiconductor, and the GOA technology can be used to fabricate the gate driver on the TFT array substrate to achieve system integration, saving space and the driver IC.

FIG. 1 is a schematic view showing a known GOA circuit, comprising a plurality of cascade GOA units, with the GOA unit of each stage comprising: a control input unit 100, a regulation unit 200, a control output unit 300, a pull-down holding unit 400, a pull-down unit 500, and a second node control unit 600; for a positive integer n, other than the first stage GOA unit, in the n-th stage GOA unit:

The control input unit 100 comprises: a first TFT T1, with gate connected to a control clock signal XCK, source connected to an output end G(n−1) of the GOA unit of the previous stage ((n−1)-th stage), and drain connected to a third node K(n).

The regulation unit 200 comprises: a second TFT T2, with gate connected to a constant high voltage VGH, source connected to the third node K(n), and drain connected to a first node Q(n).

The control output unit 300 comprises: a third TFT T3, with gate connected to the first node Q(n), source connected to an output clock signal CK, and drain connected to an output end G(n); and a first capacitor C1, with one end connected to the first node Q(n), and the other connected to the output end G(n).

The pull-down holding unit 400 comprises: a fifth TFT T5, with gate connected to a second node P(n), source connected to the output end G(n), and drain connected to a constant low voltage VGL; and a second capacitor C2, with one end connected to the second node P(n), and the other connected to the constant low voltage VGL.

The pull-down unit 500 comprises: a sixth TFT T6, with gate connected to the output clock signal CK, source connected to the third node K(n), and drain to the source of a seventh TFT T7; and a seventh TFT T7, with gate connected to the second node P(n), and drain connected to the constant low voltage VGL.

The second node control unit 600 comprises: a fourth TFT T4, with gate connected to the third node K(n), source connected to the control clock signal XCK, and drain connected to the second node P(n); and an eighth TFT T8, with gate connected to the control clock signal XCK, source connected to the constant high voltage VGH, and the drain connected to the second node P(n).

FIG. 2 is a schematic view showing the structure of the GOA circuit for dual-side driving progressive scanning. A GOA circuit is disposed on both the left and right sides of the display panel, with each GOA circuit comprising GOA units from the first stage to the last stage. The GOA circuit on both sides has the same timing sequence, and the GOA unit of each stage on both sides receives a first clock signal CK(1) and a second clock signal CK(2) alternatingly as the control clock signal XCK and the output clock signal CK. The GOA circuit on both sides scans line-by-line according to the pixel layout, and the GOA unit of the same stage on both sides operates on the same column of each pixels. Refer to FIG. 3. When the GOA circuit shown in FIG. 1 performs dual-side driving progressive scanning, the wave forms of the first node Q(n), second node P(n), output end G(n) of the GOA unit each stage are all stable. Therefore, the GOA circuit shown in FIG. 1 can operate stably in the dual-side driving progressive scanning architecture.

FIG. 4 is a schematic view showing the structure of the GOA circuit for dual-side driving interlaced scanning. A GOA circuit is disposed on both the left and right sides of the display panel, with the GOA circuit on one side comprising GOA units from the odd-numbered stages, and the GOA circuit on the other side comprising GOA units from the even-numbered stages. The GOA circuit on both sides has different timing sequence. The GOA circuit on one side receives a first clock signal CK(1) and a third clock signal CK(3) alternatingly as the control clock signal XCK and the output clock signal CK to perform progressive scanning on the odd-numbered columns of the pixels, and the GOA circuit on the other side receives a second clock signal CK(2) and a fourth clock signal CK(4) alternatingly as the control clock signal XCK and the output clock signal CK to perform progressive scanning on the even-numbered columns of the pixels. Refer to FIG. 5. When the GOA circuit shown in FIG. 1 performs dual-side driving interlaced scanning, a plurality of unstable factors exists in the circuit. This is because the two clock signals on each side are not continuous, and no current leakage prevention design for the first node Q(n) is included in the known GOA circuit. The current leakage in the first node Q(n) will make the GOA circuit ineffective, and a blind interval occurs when the output end G(n) finishes outputting and the control clock signal XCK and the output clock signal CK are both at low level, which also makes the GOA circuit unstable and may even render the GOA circuit ineffective. Therefore, it is imperative to improve the known GOA circuit shown in FIG. 1, which is unable to perform stably in the dual-side interlaced scanning architecture.

SUMMARY OF THE INVENTION

The object of the present invention is to provide a GOA circuit for narrow border LCD panel, applicable to dual-side progressive scanning architecture and also applicable to dual-side interlaced scanning architecture, and able to prevent current leakage in the first node under the dual-side interlaced scanning architecture to ensure the stable operation of the circuit and greatly improve the reliability of the GOA circuit.

To achieve the above object, the present invention provides a GOA circuit for narrow border LCD panel, which comprises:

a plurality of cascade GOA units, with GOA unit each stage comprising: a control input unit, a regulation unit, a control output unit, a pull-down holding unit, a pull-down unit, a second node control unit, and a first node leakage prevention unit;

for a positive integer n, in the GOA unit of the n-th stage:

the control input unit comprising: a first TFT, with gate connected to a stage-propagated signal, source connected to a first constant voltage, and drain connected to a third node;

the regulation unit comprising: a second TFT, with gate connected to the first constant voltage, source connected to the third node, and drain connected to a first node;

the control output unit comprising: a third TFT, with gate connected to the first node, source connected to an output clock signal, and drain connected to an output end; and a first capacitor, with one end connected to the first node, and the other connected to the output end;

the pull-down holding unit comprising: a fifth TFT, with gate connected to a second node, source connected to the output end, and drain connected to a second constant voltage; and a second capacitor, with one end connected to the second node, and the other connected to the second constant voltage;

the pull-down unit comprising: a sixth TFT, with gate connected to a fourth node, source connected to the third node, and drain to the source of a seventh TFT; and a seventh TFT, with gate connected to the second node, and drain connected to the second constant voltage;

the second node control unit comprising: a fourth TFT, with gate connected to the third node, source connected to the control clock signal, and drain connected to the second node; and an eighth TFT, with gate connected to the control clock signal, source connected to the first constant voltage, and drain connected to the second node;

the first node leakage prevention unit comprising: a ninth TFT, with gate and source connected to the output clock signal, and drain connected to the fourth node; a tenth TFT, with gate connected to the stage-propagated signal, source connected to the fourth node, and drain connected to the second constant voltage; and a third capacitor, with one end connected to the fourth node and the other connected to the second constant voltage.

Optionally, each TFT is an N-type LTPS TFT, the first constant voltage is a constant high voltage, and the second constant voltage is a constant low voltage.

Optionally, each TFT is a P-type LTPS TFT, the first constant voltage is a constant low voltage, and the second constant voltage is a constant high voltage.

The GOA circuit for narrow border LCD panel is applicable to a display panel with the dual-side progressive scanning architecture, with a GOA circuit disposed on both the left side and the right side of the display panel, the GOA circuit on both sides comprising GOA units of each stage; the GOA unit of each stage on both sides receiving two clock signals: a first clock signal and a second clock signal; the first clock signal and the second clock signal having opposite phases.

In the GOA unit of each stage, the first clock signal and the second clock signal alternatingly serve as the output clock signal and the control clock signal, respectively.

Other than the first stage, the stage-propagated signal for the n-th GOA unit is the output signal of the previous stage GOA unit, i.e., (n−1)-th stage GOA unit; and the stage-propagated signal for the first stage GOA unit is the circuit start signal.

The GOA circuit for narrow border LCD panel is applicable to a display panel with the dual-side interlaced scanning architecture, with a GOA circuit disposed on both the left side and the right side of the display panel, the GOA circuit on one side comprising only GOA units of odd-numbered stages and the GOA circuit on the other side comprising only GOA units of even-numbered stages;

the GOA unit of each stage on one side receiving two clock signals: a first clock signal and a third clock signal; and the GOA unit of each stage on the other side receiving two clock signals: a second clock signal and a fourth clock signal.

The first clock signal, the second clock signal, the third clocks signal and the fourth clock signal have the same pulse cycles; the falling edge of the first clock signal and the rising edge of the second clock signal are generated simultaneously; the falling edge of the second clock signal and the rising edge of the third clock signal are generated simultaneously; the falling edge of the third clock signal and the rising edge of the fourth clock signal are generated simultaneously; the falling edge of the fourth clock signal and the rising edge of the first clock signal are generated simultaneously.

In the GOA unit of each stage on one side, the first clock signal and the third clock signal alternatingly serve as the output clock signal and the control clock signal, respectively; in the GOA unit of each stage on the other side, the second clock signal and the fourth clock signal alternatingly serve as the output clock signal and the control clock signal, respectively.

Other than the first stage and the second stage, the stage-propagated signal for the n-th GOA unit is the output signal of the second stage earlier than the current stage, i.e., (n−2)-th stage GOA unit; and the stage-propagated signal for the first stage GOA unit and the second stage GOA unit is the circuit start signal.

The present invention also provides a GOA circuit for narrow border LCD panel, which comprises: a plurality of cascade GOA units, with GOA unit each stage comprising: a control input unit, a regulation unit, a control output unit, a pull-down holding unit, a pull-down unit, a second node control unit, and a first node leakage prevention unit;

for a positive integer n, in the GOA unit of the n-th stage:

the control input unit comprising: a first TFT, with gate connected to a stage-propagated signal, source connected to a first constant voltage, and drain connected to a third node;

the regulation unit comprising: a second TFT, with gate connected to the first constant voltage, source connected to the third node, and drain connected to a first node;

the control output unit comprising: a third TFT, with gate connected to the first node, source connected to an output clock signal, and drain connected to an output end; and a first capacitor, with one end connected to the first node, and the other connected to the output end;

the pull-down holding unit comprising: a fifth TFT, with gate connected to a second node, source connected to the output end, and drain connected to a second constant voltage; and a second capacitor, with one end connected to the second node, and the other connected to the second constant voltage;

the pull-down unit comprising: a sixth TFT, with gate connected to a fourth node, source connected to the third node, and drain to the source of a seventh TFT; and a seventh TFT, with gate connected to the second node, and drain connected to the second constant voltage;

the second node control unit comprising: a fourth TFT, with gate connected to the third node, source connected to the control clock signal, and drain connected to the second node; and an eighth TFT, with gate connected to the control clock signal, source connected to the first constant voltage, and drain connected to the second node;

the first node leakage prevention unit comprising: a ninth TFT, with gate and source connected to the output clock signal, and drain connected to the fourth node; a tenth TFT, with gate connected to the stage-propagated signal, source connected to the fourth node, and drain connected to the second constant voltage; and a third capacitor, with one end connected to the fourth node and the other connected to the second constant voltage;

wherein when applied to a display panel with the dual-side progressive scanning architecture, with a GOA circuit disposed on both the left side and the right side of the display panel, the GOA circuit on both sides comprising GOA units of each stage; the GOA unit of each stage on both sides receiving two clock signals: a first clock signal and a second clock signal; the first clock signal and the second clock signal having opposite phases;

wherein in the GOA unit of each stage, the first clock signal and the second clock signal alternatingly serve as the output clock signal and the control clock signal, respectively;

wherein other than the first stage, the stage-propagated signal for the n-th GOA unit is the output signal of the previous stage GOA unit, i.e., (n−1)-th stage GOA unit; and the stage-propagated signal for the first stage GOA unit is the circuit start signal.

Compared to the known techniques, the present invention provides the following advantages: the present invention provides a GOA circuit for narrow border LCD panel, by disposing a first node leakage prevention unit comprised of a ninth TFT, a tenth TFT and a third capacitor, wherein the ninth TFT has gate and source connected to the output clock signal to form a diode structure to charge the third capacitor and the fourth node to a high voltage; the tenth TFT clears the fourth node during the stage-propagated signal duration to ensure normal charging for the first node. The GOA circuit is applicable to dual-side progressive scanning architecture and also applicable to dual-side interlaced scanning architecture, and able to prevent current leakage in the first node under the dual-side interlaced scanning architecture to ensure the stable operation of the circuit and greatly improve the reliability of the GOA circuit. Moreover, with only two clock signals on each side, the present invention is suitable for narrow border display panel.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
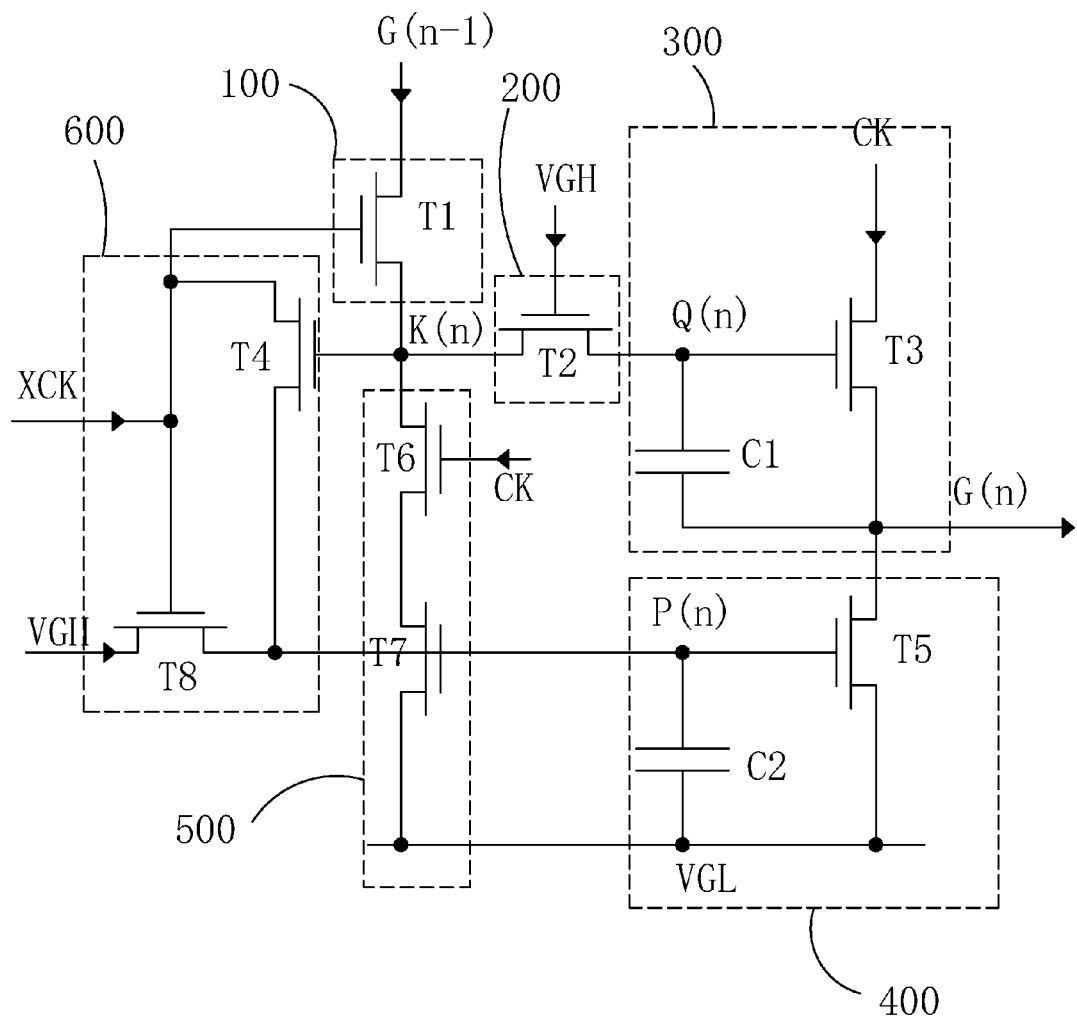
FIG. 1 is a schematic view showing the structure of known GOA circuit.

To further explain the technical means and effect of the present invention, the following refers to embodiments and drawings for detailed description.

Refer to FIG. 6, 7, 8, or 9. The present invention provides a GOA circuit for narrow border LCD panel, which comprises: a plurality of cascade GOA units, with GOA unit each stage comprising: a control input unit 100, a regulation unit 200, a control output unit 300, a pull-down holding unit 400, a pull-down unit 500, a second node control unit 600, and a first node leakage prevention unit 700.

For a positive integer n, in the GOA unit of the n-th stage:

The control input unit 100 comprises: a first TFT T1, with gate connected to a stage-propagated signal, source connected to a first constant voltage, and drain connected to a third node K(n).

The regulation unit 200 comprises: a second TFT T2, with gate connected to the first constant voltage, source connected to the third node K(n), and drain connected to a first node Q(n).

The control output unit 300 comprises: a third TFT T3, with gate connected to the first node Q(n), source connected to an output clock signal CK, and drain connected to an output end G(n); and a first capacitor C1, with one end connected to the first node Q(n), and the other connected to the output end G(n).

The pull-down holding unit 400 comprises: a fifth TFT T5, with gate connected to a second node P(n), source connected to the output end G(n), and drain connected to a second constant voltage; and a second capacitor C2, with one end connected to the second node P(n), and the other connected to the second constant voltage.

The pull-down unit 500 comprises: a sixth TFT T6, with gate connected to a fourth node H(n), source connected to the third node K(n), and drain to the source of a seventh TFT T7; and a seventh TFT T7, with gate connected to the second node P(n), and drain connected to the second constant voltage.

The second node control unit 600 comprises: a fourth TFT T4, with gate connected to the third node K(n), source connected to the control clock signal XCK, and drain connected to the second node P(n); and an eighth TFT T8, with gate connected to the control clock signal XCK, source connected to the first constant voltage, and drain connected to the second node P(n).

The first node leakage prevention unit 700 comprises: a ninth TFT T9, with gate and source connected to the output clock signal CK, and drain connected to the fourth node H(n); a tenth TFT T10, with gate connected to the stage-propagated signal, source connected to the fourth node H(n), and drain connected to the second constant voltage; and a third capacitor C3, with one end connected to the fourth node H(n) and the other connected to the second constant voltage.

Figure 6:
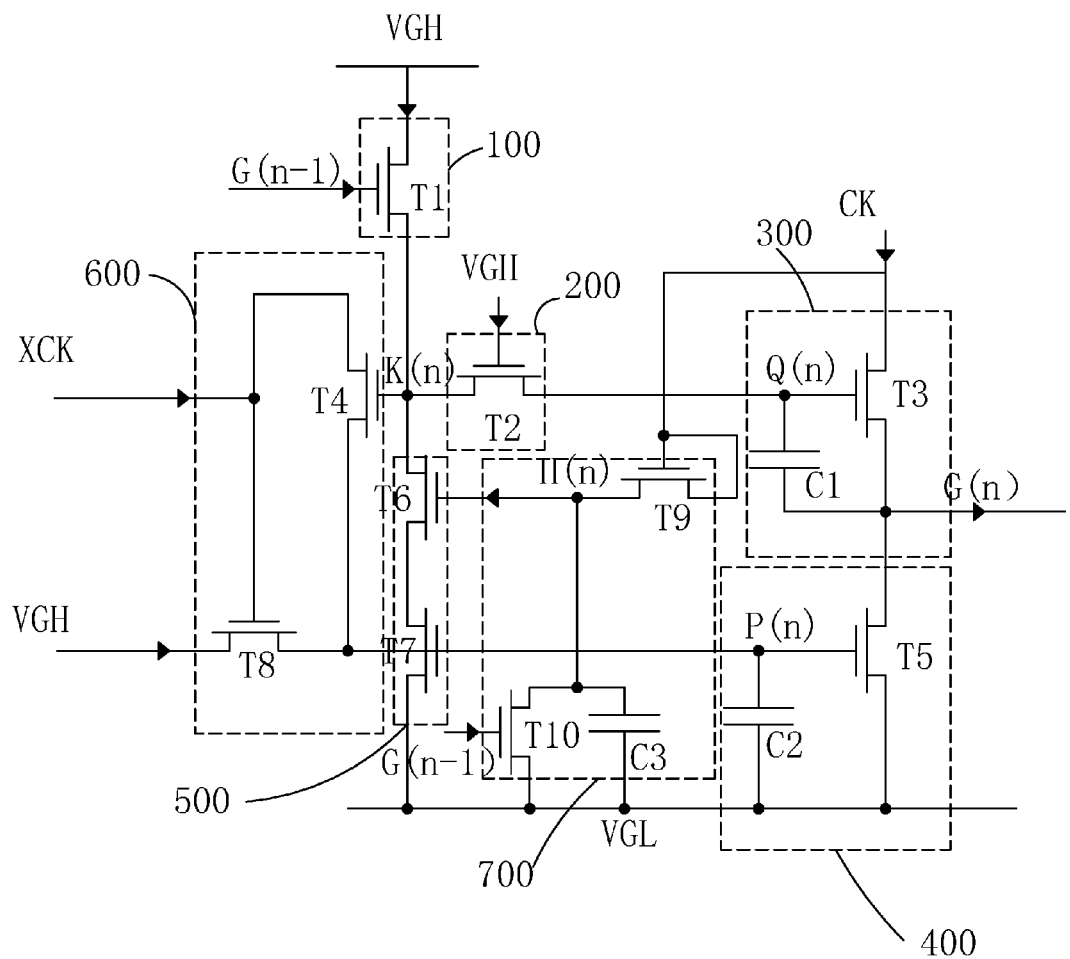
FIG. 6 is a schematic view showing the first embodiment of the GOA circuit for narrow border LCD panel provided by the an embodiment of the present invention.
Figure 10:
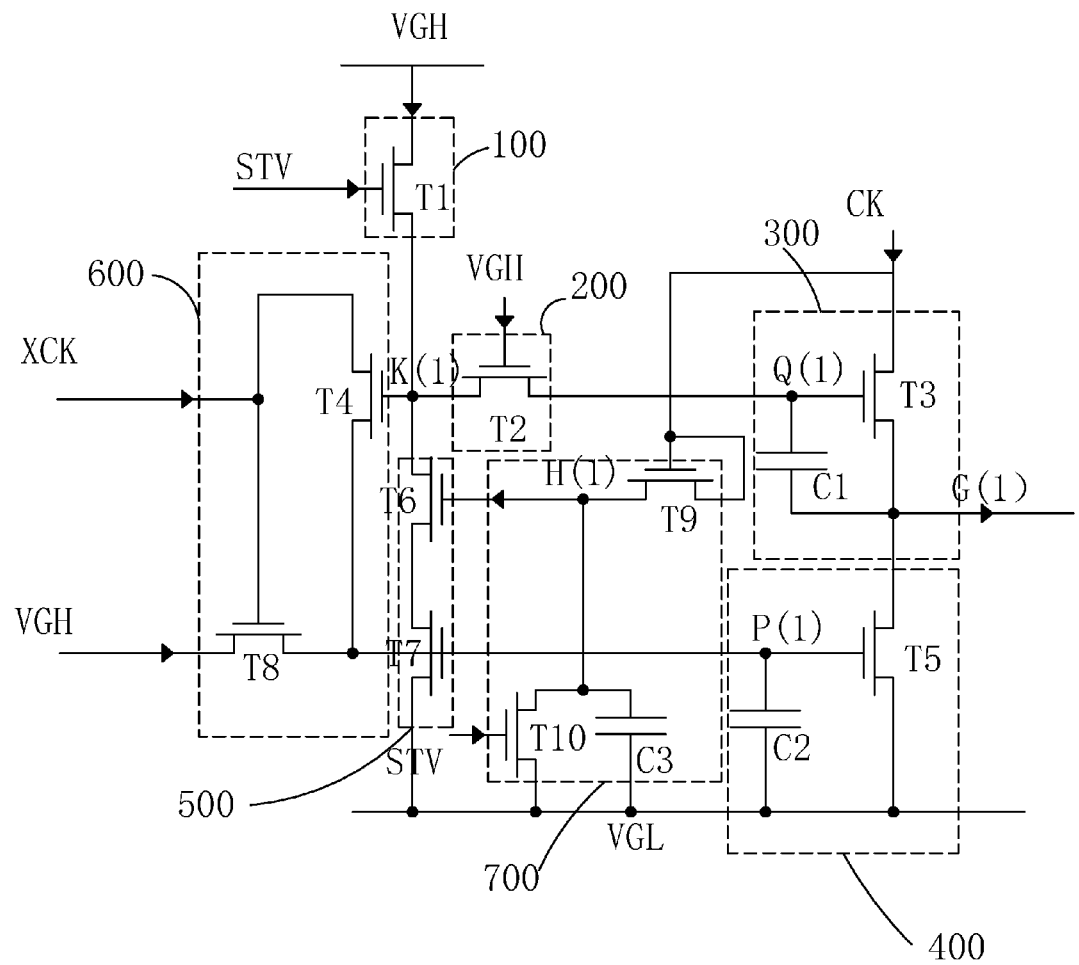
FIG. 10 is a schematic view showing the first stage GOA unit for the first and third embodiments of the GOA circuit for narrow border LCD panel of the present invention.

Specifically, in the first embodiment of the GOA circuit for narrow border LCD panel of the present invention shown in FIG. 6, each TFT is an N-type LTPS TFT, the first constant voltage is a constant high voltage VGH, and the second constant voltage is a constant low voltage VGL; other than the first stage, the stage-propagated signal for the n-th GOA unit is the output signal G(n−1) of the previous stage GOA unit, i.e., (n−1)-th stage GOA unit; and specifically, as shown in FIG. 10, the stage-propagated signal for the first stage GOA unit is the circuit start signal SW.

Figure 7:
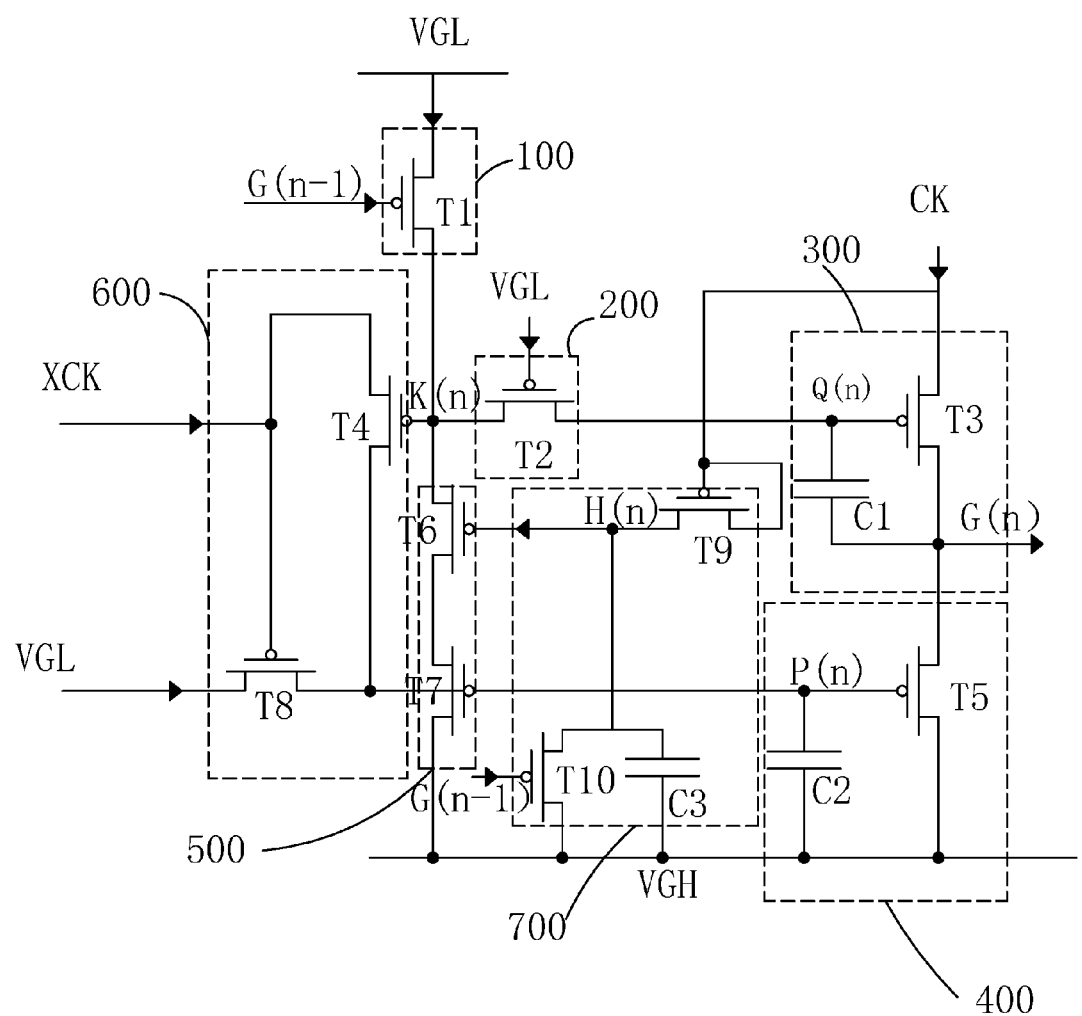
FIG. 7 is a schematic view showing the second embodiment of the GOA circuit for narrow border LCD panel provided by the an embodiment of the present invention.
Figure 11:
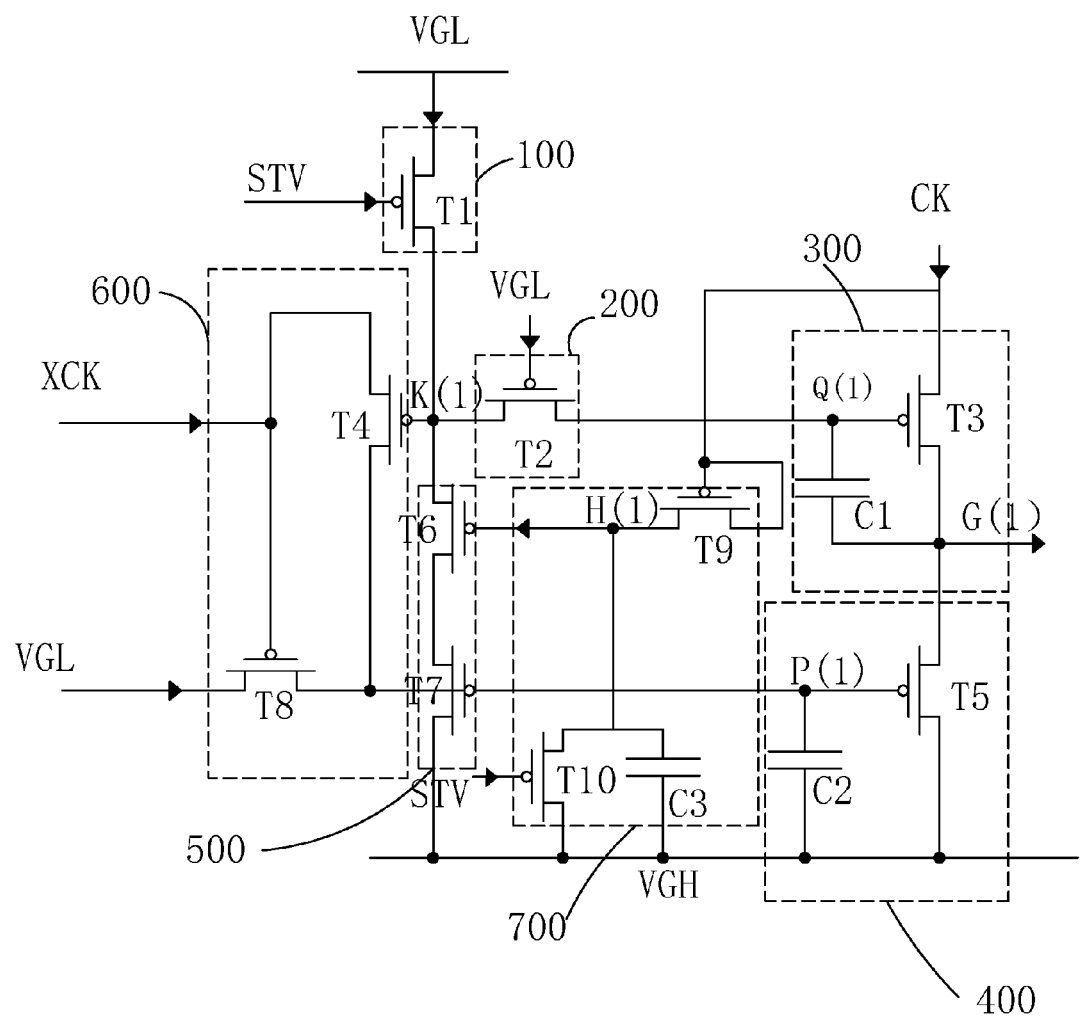
FIG. 11 is a schematic view showing the first stage GOA unit for the second and fourth embodiments of the GOA circuit for narrow border LCD panel of the present invention.

In the second embodiment of the GOA circuit for narrow border LCD panel of the present invention shown in FIG. 7, each TFT is a P-type LTPS TFT, the first constant voltage is a constant low voltage VGL, and the second constant voltage is a constant high voltage VGH; other than the first stage, the stage-propagated signal for the n-th GOA unit is the output signal G(n−1) of the previous stage GOA unit, i.e., (n−1)-th stage GOA unit; and specifically, as shown in FIG. 11, the stage-propagated signal for the first stage GOA unit is the circuit start signal STV.

Figure 2:
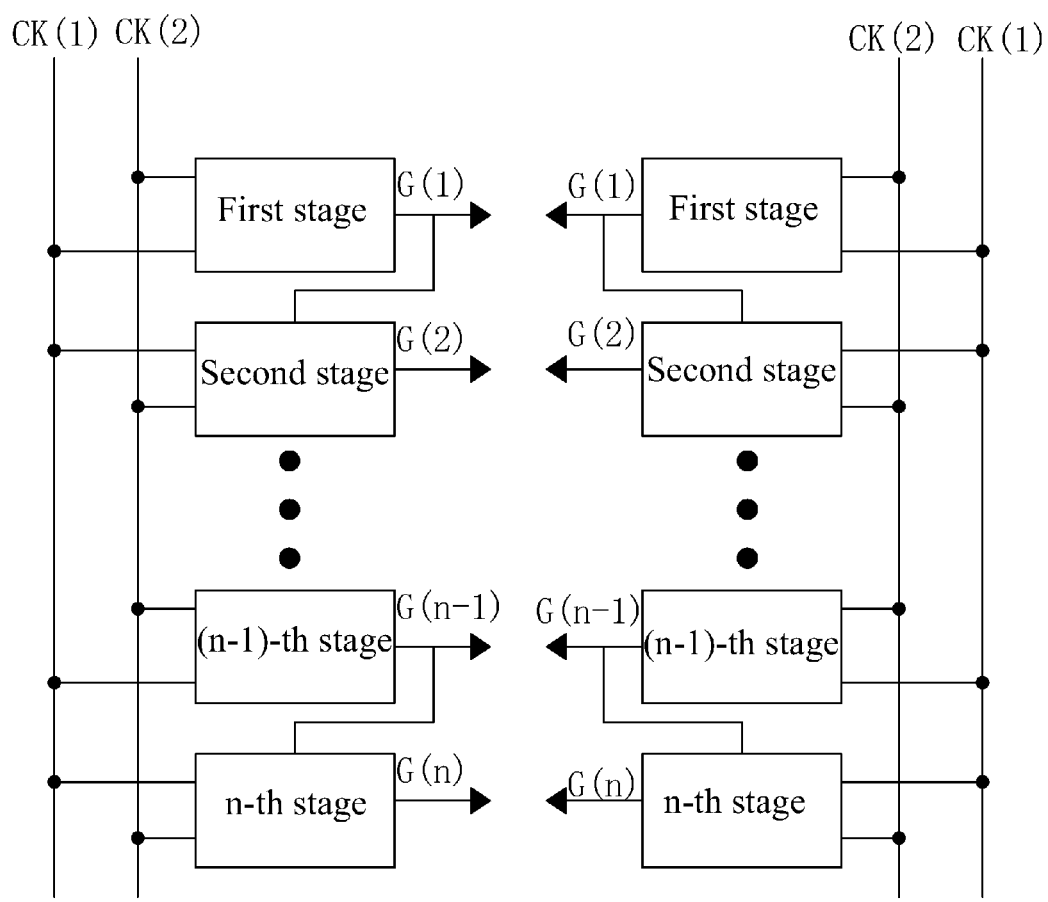
FIG. 2 is a schematic view showing the known GOA circuit under dual-side progressive scanning architecture.
Figure 3:
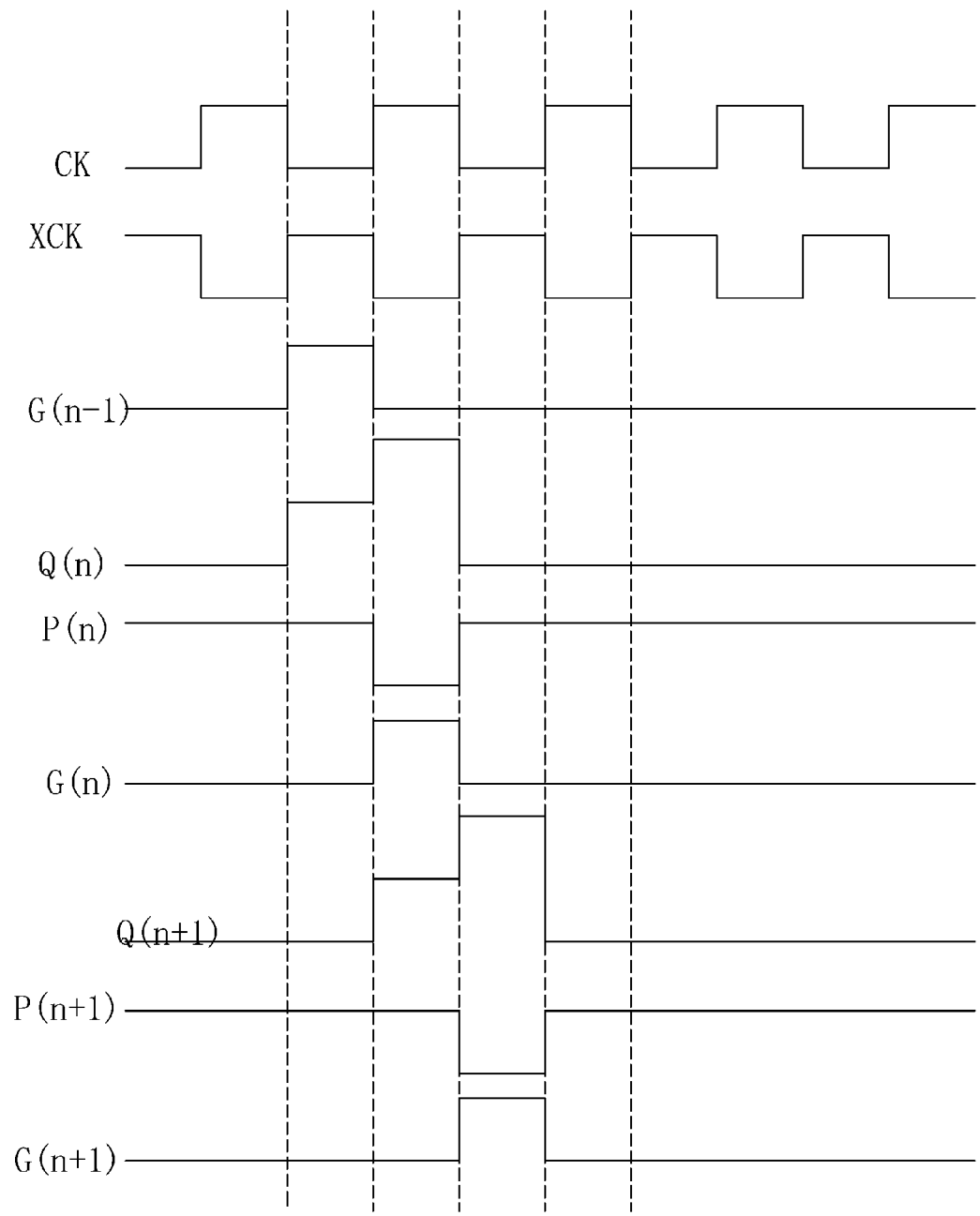
FIG. 3 is a schematic view showing the timing of the GOA circuit of FIG. 1 applied to the architecture of FIG. 2.

The first and the second embodiments are applicable to a display panel with the dual-side progressive scanning architecture shown in FIG. 2, with a GOA circuit disposed on both the left side and the right side of the display panel, and the GOA circuit on both sides comprises GOA units of each stage. The GOA unit of each stage on both sides receives two clock signals: a first clock signal CK(1) and a second clock signal CK(2); the first clock signal and the second clock signal have opposite phases. In the GOA unit of each stage, the first clock signal CK(1) and the second clock signal CK(2) alternatingly serve as the output clock signal CK and the control clock signal XCK, respectively.

Figure 8:
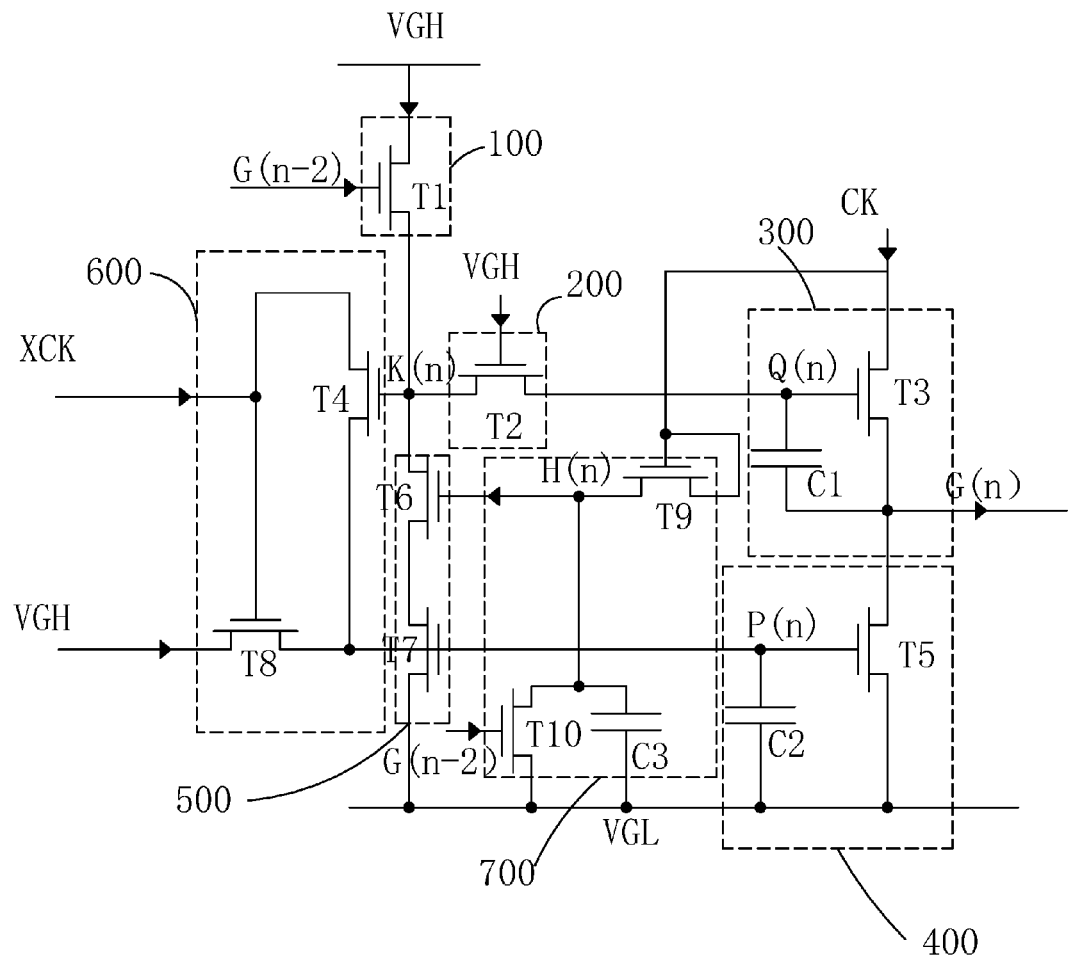
FIG. 8 is a schematic view showing the third embodiment of the GOA circuit for narrow border LCD panel provided by the an embodiment of the present invention.
Figure 12:
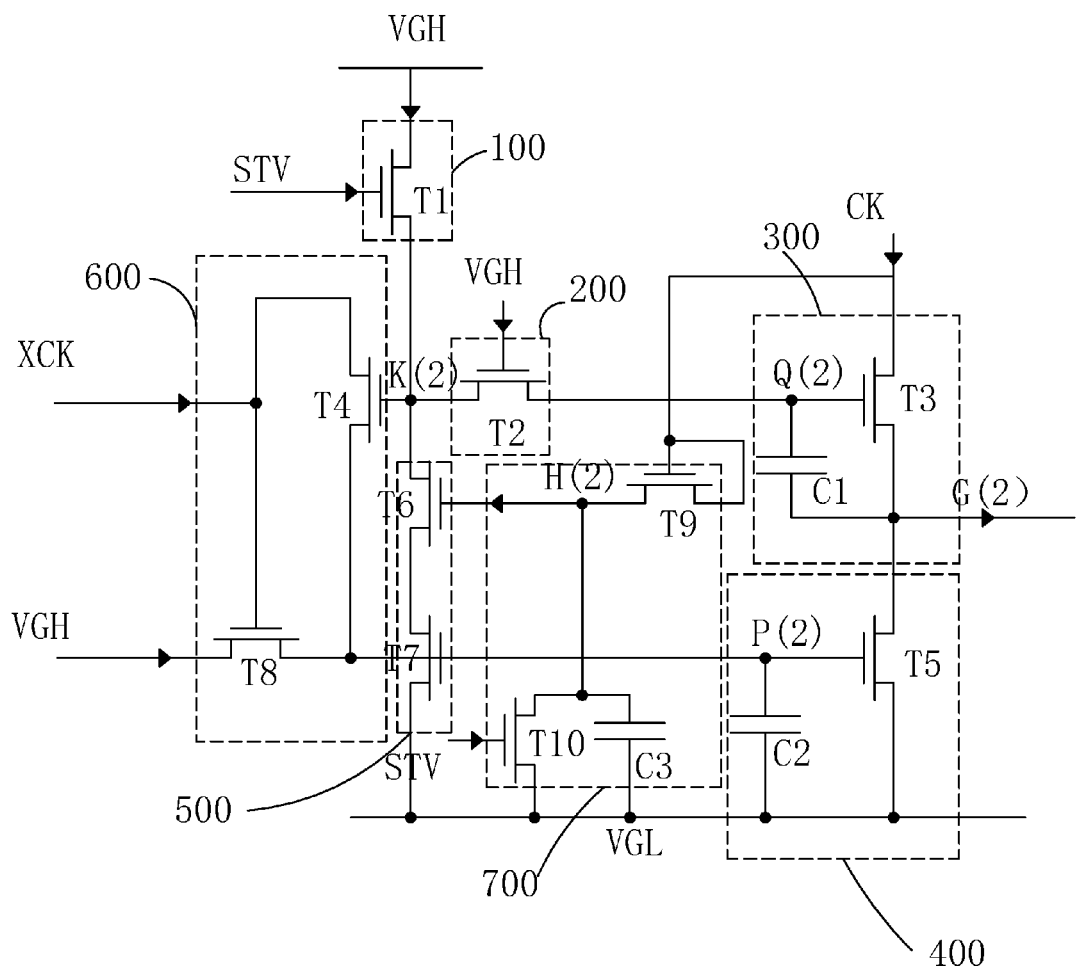
FIG. 12 is a schematic view showing the second stage GOA unit for the third embodiment of the GOA circuit for narrow border LCD panel of the present invention.
Figure 13:
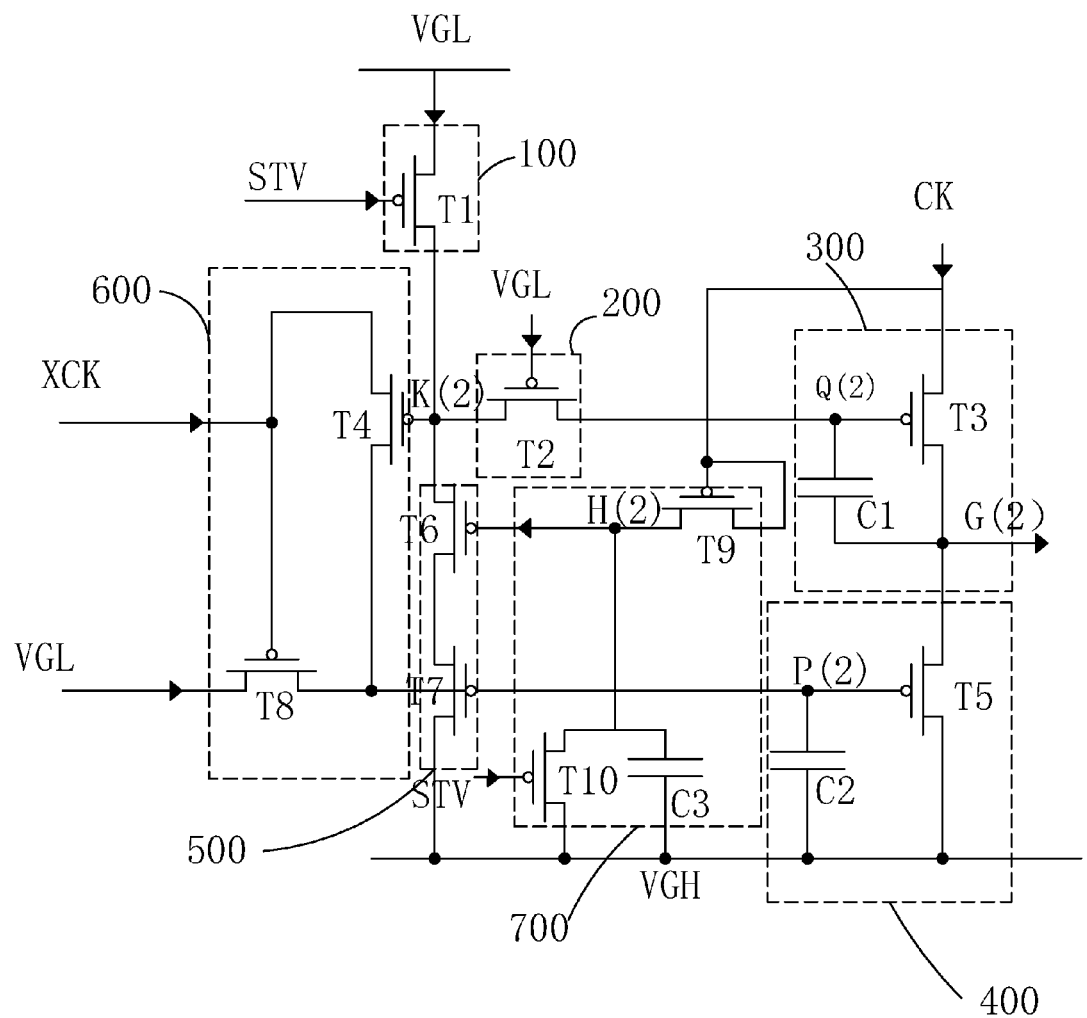
FIG. 13 is a schematic view showing the second stage GOA unit for the fourth embodiment of the GOA circuit for narrow border LCD panel of the present invention.

In the third embodiment of the GOA circuit for narrow border LCD panel of the present invention shown in FIG. 8, each TFT is an N-type LTPS TFT, the first constant voltage is a constant high voltage VGH, and the second constant voltage is a constant low voltage VGL; other than the first stage and the second stage, the stage-propagated signal for the n-th GOA unit is the output signal (n−2) of the second stage earlier than the current stage, i.e., (n−2)-th stage GOA unit; and specifically, as shown in FIGS. 10, 12, the stage-propagated signal for the first stage GOA unit and the second stage GOA unit is the circuit start signal STV.

Figure 9:
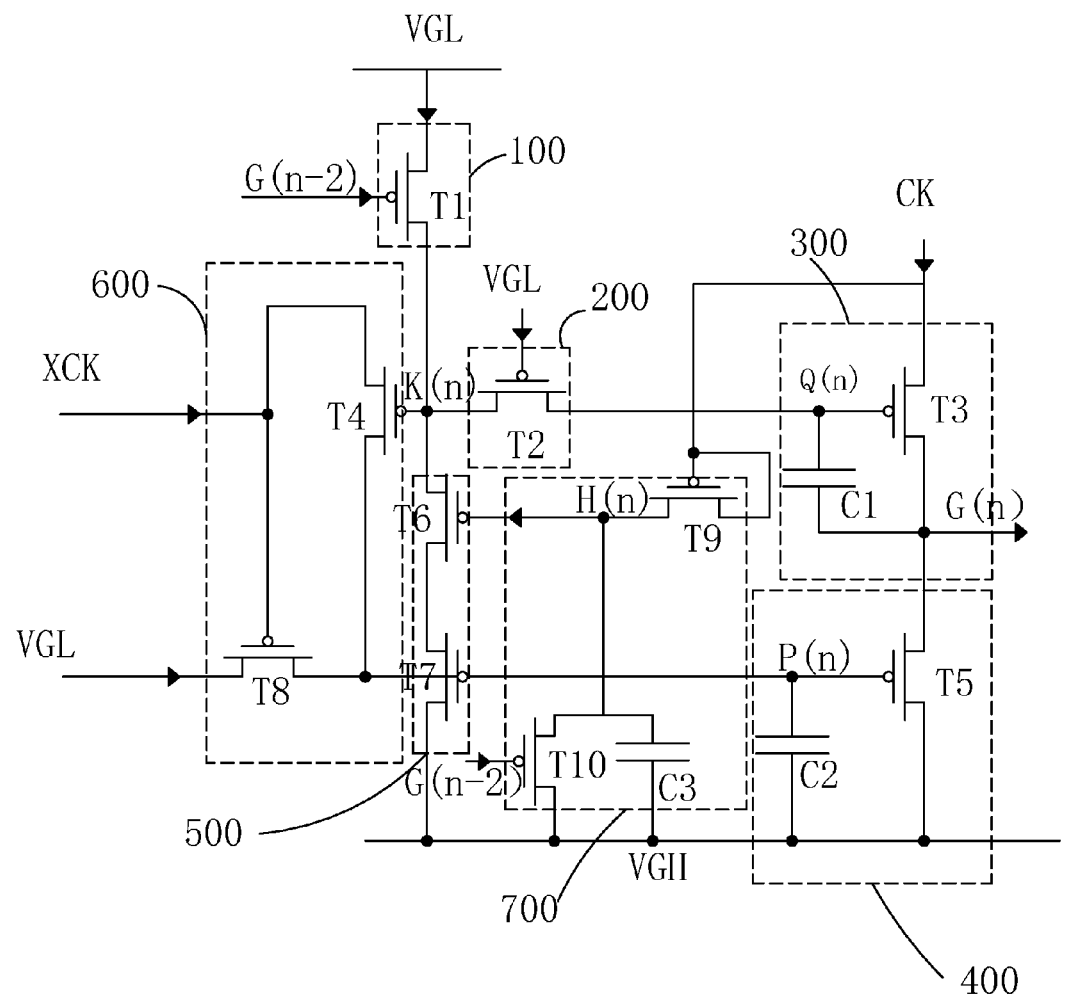
FIG. 9 is a schematic view showing the fourth embodiment of the GOA circuit for narrow border LCD panel provided by the an embodiment of the present invention.

In the fourth embodiment of the GOA circuit for narrow border LCD panel of the present invention shown in FIG. 9, each TFT is a P-type LTPS TFT, the first constant voltage is a constant low voltage VGL, and the second constant voltage is a constant high voltage VGH; other than the first stage and the second stage, the stage-propagated signal for the n-th GOA unit is the output signal (n−2) of the second stage earlier than the current stage, i.e., (n−2)-th stage GOA unit; and specifically, as shown in FIGS. 10, 12, the stage-propagated signal for the first stage GOA unit and the second stage GOA unit is the circuit start signal STV.

Figure 4:
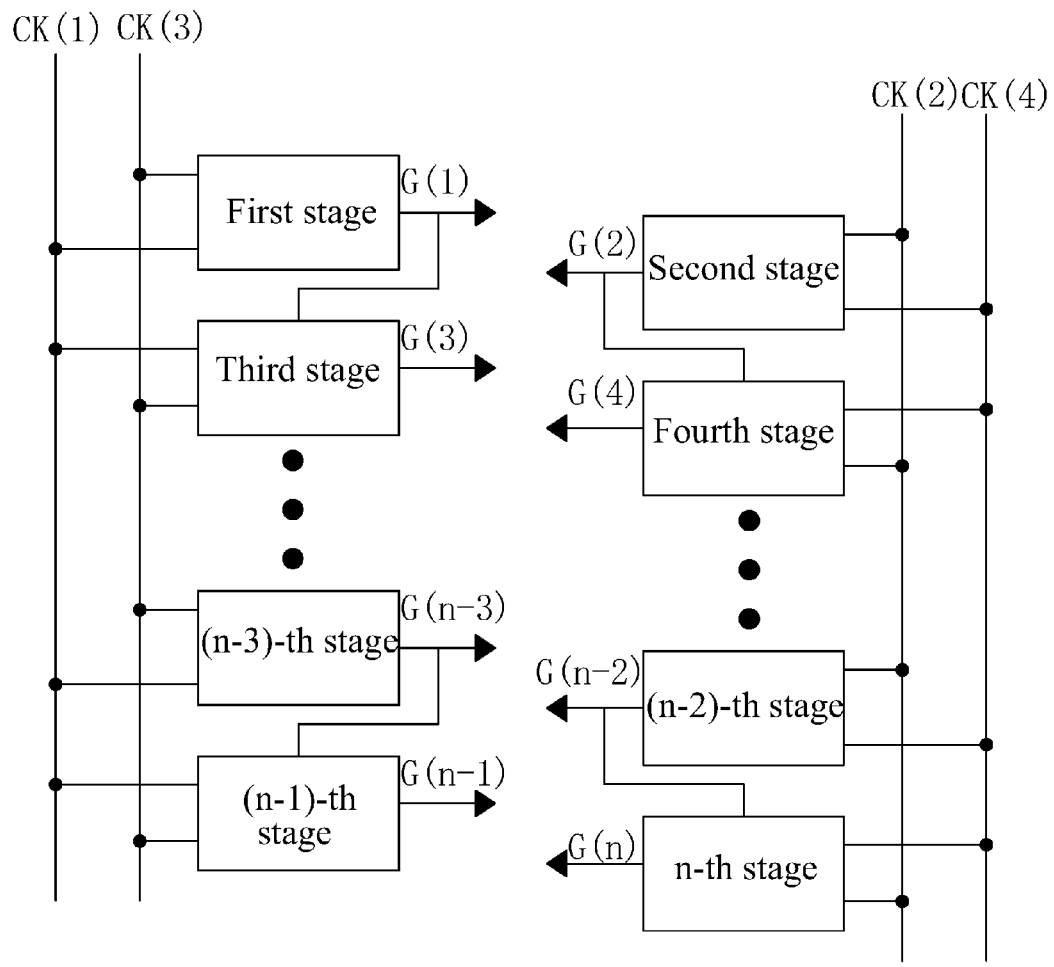
FIG. 4 is a schematic view showing the known GOA circuit under dual-side interlaced scanning architecture.
Figure 5:
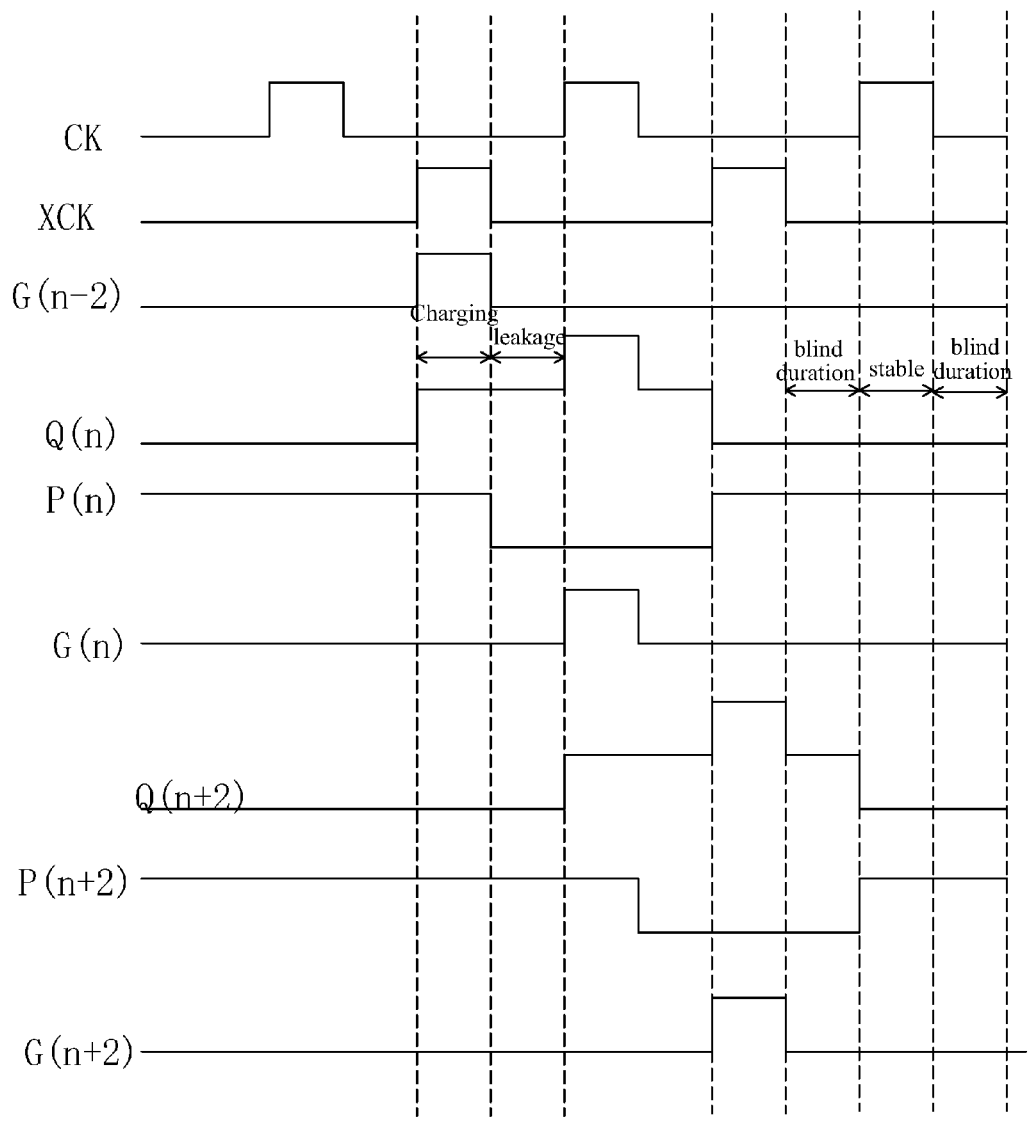
FIG. 5 is a schematic view showing the timing of the GOA circuit of FIG. 1 applied to the architecture of FIG. 4.

The third and the fourth embodiments are applicable to a display panel with the dual-side interlaced scanning architecture shown in FIG. 4, with a GOA circuit disposed on both the left side and the right side of the display panel, the GOA circuit on one side comprises only GOA units of odd-numbered stages for scanning the odd-numbered columns of pixels and the GOA circuit on the other side comprises only GOA units of even-numbered stages for scanning the even-numbered columns of pixels. The GOA unit of each stage on one side receives two clock signals: a first clock signal CK(1) and a third clock signal CK(3); and the GOA unit of each stage on the other side receives two clock signals: a second clock signal CK(2) and a fourth clock signal CK(4). Moreover, he first clock signal CK(1), the second clock signal CK(2), the third clocks signal CK(3) and the fourth clock signal CK(4) have the same pulse cycles; the falling edge of the first clock signal CK(1) and the rising edge of the second clock signal CK(2) are generated simultaneously; the falling edge of the second clock signal CK(2) and the rising edge of the third clock signal CK(3) are generated simultaneously; the falling edge of the third clock signal CK(3) and the rising edge of the fourth clock signal CK(4) are generated simultaneously; the falling edge of the fourth clock signal CK(4) and the rising edge of the first clock signal CK(1) are generated simultaneously. In the GOA unit of each stage on one side, the first clock signal CK(1) and the third clock signal CK(3) alternatingly serve as the output clock signal CK and the control clock signal XCK, respectively; in the GOA unit of each stage on the other side, the second clock signal CK(2) and the fourth clock signal CK(4) alternatingly serve as the output clock signal CK and the control clock signal XCK, respectively.

Figure 14:
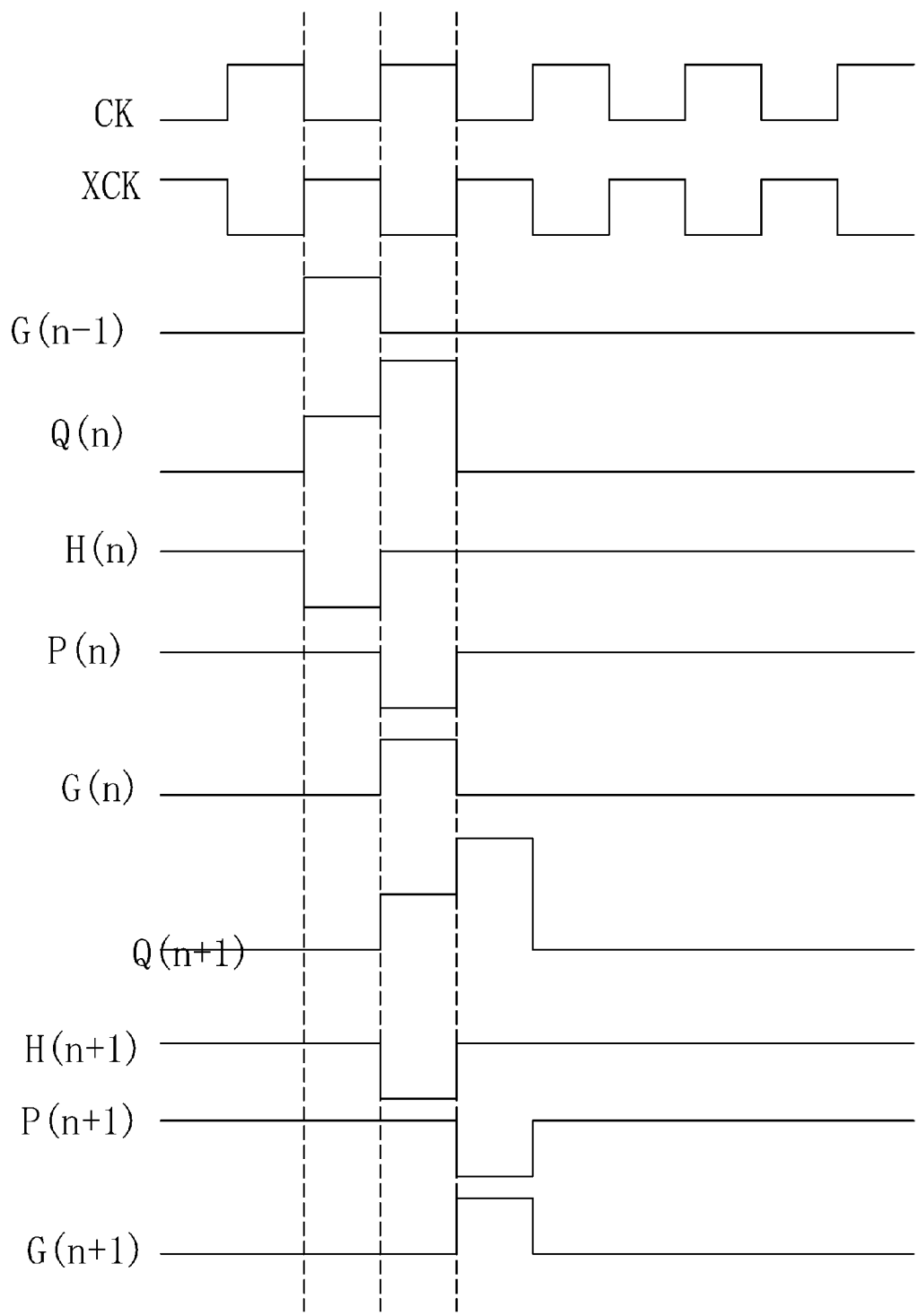
FIG. 14 is a schematic view showing the timing of the first embodiment of the GOA circuit for narrow border LCD panel applied to the dual-side progressive scanning architecture of FIG. 2.

Refer to FIG. 6 and FIG. 14, as well as FIG. 2. The specific process of the first embodiment of the GOA circuit for narrow border LCD panel operates as follows:

First, the control clock signal XCK and the output signal G(n−1) of the (n−1)-th stage GOA unit provide a high voltage, and the first TFT T1 and the eighth TFT T8 are turned on; the second TFT T2 is always turned on under the constant high voltage VGH, the third node K(n), the first node Q(n) and the second node P(n) are charged to high voltage; the tenth TFT T10 is turned on to pull the fourth node H(n) to the low voltage and turn off the sixth TFT T6, which is controlled by the fourth node H(n).

Then, the control clock signal XCK and the output signal G(n−1) of the (n−1)-th stage GOA unit turn to a low voltage. At the same time, the output clock signal CK provides a high voltage, the first TFT T1, eighth TFT T8, and tenth TFT T10 are turned off, the first node Q(n) stays at high under the storage effect of the first capacitor C1, the third TFT T3 is turned on to output the high voltage of the output clock signal CK as the output signal G(n) of the n-th stage GOA unit, and raises the first node Q(n) to a higher voltage; the fourth TFT T4 is turned on, the second node P(n) is pulled down by the low control clock signal XCK to the low voltage to turn off the fifth TFT T5 and the seventh TFT T7 to ensure the normal output for G(n); the ninth TFT T9 is controlled by the high output clock signal CK to turn on, and the fourth node H(n) is charged to the high voltage.

Then, the control clock signal XCK provides a high voltage again, the eighth TFT T8 is turned on, the second node P(n) is charged to the high voltage, the fifth TFT T5 is turned on to pull down the output signal G(n) to the low voltage; the seventh TFT T7 is turned on, the fourth node H(n) stays high under the storage effect of the third capacitor C3, the sixth TFT T6 is turned on to pull down the third node K(n) and the first node Q(n) to stay at low voltage.

As shown, in the operation process of the first embodiment, the waveform of each node is stable, and the present invention is applicable to a display panel with the dual-side progressive scanning architecture.

The operation process of the second embodiment in FIG. 7 is similar to the first embodiment, with the voltage levels of the signals and nodes switched from high to low and vice versa, and the detailed description will be omitted.

Figure 15:
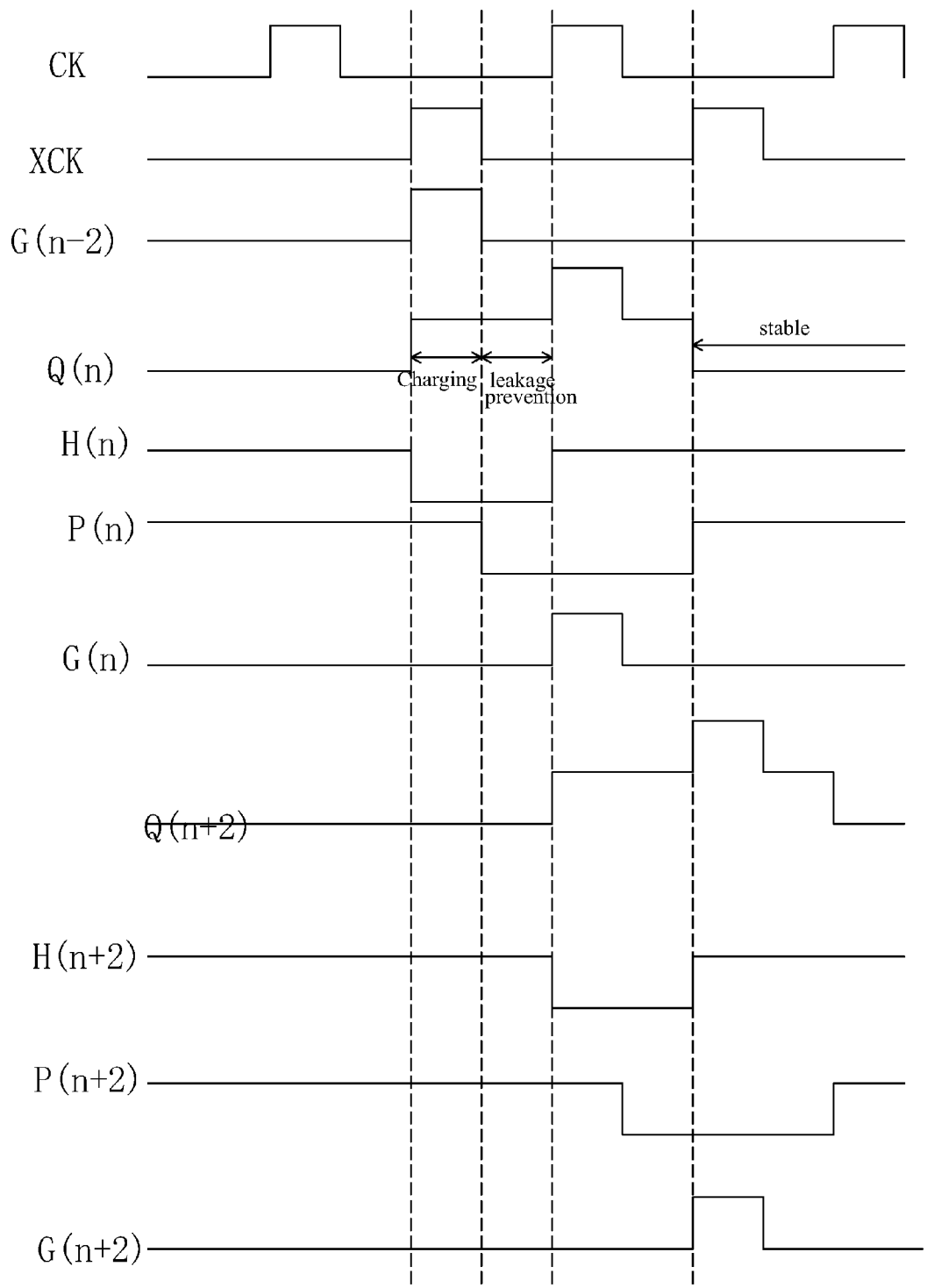
FIG. 15 is a schematic view showing the timing of the third embodiment of the GOA circuit for narrow border LCD panel applied to the dual-side interlaced scanning architecture of FIG. 4.

Refer to FIG. 8 and FIG. 15, as well as FIG. 4. The specific process of the third embodiment of the GOA circuit for narrow border LCD panel operates as follows:

First, the control clock signal XCK and the output signal G(n−2) of the (n−2)-th stage GOA unit provide a high voltage, and the first TFT T1 and the eighth TFT T8 are turned on; the second TFT T2 is always turned on under the constant high voltage VGH, the third node K(n), the first node Q(n) and the second node P(n) are charged to high voltage; the tenth TFT T10 is turned on to pull the fourth node H(n) to the low voltage and turn off the sixth TFT T6, which is controlled by the fourth node H(n).

Then, the control clock signal XCK and the output signal G(n−2) of the (n−2)-th stage GOA unit turn to a low voltage. The first node Q(n) stays at high under the storage effect of the first capacitor C1, the first TFT T1, eighth TFT T8, and tenth TFT T10 are turned off, the fourth TFT T4, which is controlled by the third node K(n), is turned on, the second node P(n) is pulled down by the low control clock signal to low voltage to turn off the fifth TFT T5 and the seventh TFT T7; the fourth node H(n) stays at low under the storage effect of the third capacitor C3, the sixth TFT T6 controlled by the fourth node H(n) stays turned off and cuts off the leakage path of the first node Q(n) to prevent the first node Q(n) from current leakage.

Then, the output clock signal CK provides a high voltage, the first TFT T1, eighth TFT T8, and tenth TFT T10 stay turned off, the first node Q(n) stays at high under the storage effect of the first capacitor C1, the third TFT T3 is turned on to output the high voltage of the output clock signal CK as the output signal G(n) of the n-th stage GOA unit, and raises the first node Q(n) to a higher voltage; the fourth TFT T4 stays turned on, the second node P(n) stays low to turn off the fifth TFT T5 and the seventh TFT T7 to ensure the normal output for G(n); the ninth TFT T9 is controlled by the high output clock signal CK to turn on, and the fourth node H(n) is charged to the high voltage.

Then, the control clock signal XCK provides a high voltage again, the eighth TFT T8 is turned on, the second node P(n) is charged to the high voltage, the fifth TFT T5 is turned on to pull down the output signal G(n) to the low voltage; the seventh TFT T7 is turned on, the fourth node H(n) stays high under the storage effect of the third capacitor C3, the sixth TFT T6 is turned on to pull down the third node K(n) and the first node Q(n) to stay at low voltage.

As shown, in the operation process of the third embodiment, the waveform of each node is stable, and able to prevent current leakage of the first node Q(n) during the high voltage period, and the present invention is applicable to a display panel with the dual-side interlaced scanning architecture.

The operation process of the fourth embodiment in FIG. 9 is similar to the third embodiment, with the voltage levels of the signals and nodes switched from high to low and vice versa, and the detailed description will be omitted.

In summary, the present invention provides a GOA circuit for narrow border LCD panel, by disposing a first node leakage prevention unit comprised of a ninth TFT, a tenth TFT and a third capacitor, wherein the ninth TFT has gate and source connected to the output clock signal to form a diode structure to charge the third capacitor and the fourth node to a high voltage; the tenth TFT clears the fourth node during the stage-propagated signal duration to ensure normal charging for the first node. The GOA circuit is applicable to dual-side progressive scanning architecture and also applicable to dual-side interlaced scanning architecture, and able to prevent current leakage in the first node under the dual-side interlaced scanning architecture to ensure the stable operation of the circuit and greatly improve the reliability of the GOA circuit. Moreover, with only two clock signals on each side, the present invention is suitable for narrow border display panel.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A gate driver on array (GOA) circuit for liquid crystal display (LCD) panel, which comprises: a plurality of cascade GOA units, with GOA unit each stage comprising: a control input unit, a regulation unit, a control output unit, a pull-down holding unit, a pull-down unit, a second node control unit, and a first node leakage prevention unit;

for a positive integer n, in the GOA unit of the n-th stage:
the control input unit comprising: a first thin film transistor (TFT), with gate connected to a stage-propagated signal, source connected to a first constant voltage, and drain connected to a third node;

the regulation unit comprising: a second TFT, with gate connected to the first constant voltage, source connected to the third node, and drain connected to a first node;

the control output unit comprising: a third TFT, with gate connected to the first node, source connected to an output clock signal, and drain connected to an output end; and a first capacitor, with one end connected to the first node, and the other connected to the output end;

the pull-down holding unit comprising: a fifth TFT, with gate connected to a second node, source connected to the output end, and drain connected to a second constant voltage; and a second capacitor, with one end connected to the second node, and the other connected to the second constant voltage;

the pull-down unit comprising: a sixth TFT, with gate connected to a fourth node, source connected to the third node, and drain to a source of a seventh TFT; and a seventh TFT, with gate connected to the second node, and drain connected to the second constant voltage;

the second node control unit comprising: a fourth TFT, with gate connected to the third node, source connected to the control clock signal, and drain connected to the second node; and an eighth TFT, with gate connected to the control clock signal, source connected to the first constant voltage, and drain connected to the second node;

the first node leakage prevention unit comprising: a ninth TFT, with gate and source connected to the output clock signal, and drain connected to the fourth node; a tenth TFT, with gate connected to the stage-propagated signal, source connected to the fourth node, and drain connected to the second constant voltage; and a third capacitor, with one end connected to the fourth node and the other connected to the second constant voltage.

2. The GOA circuit for narrow border LCD panel as claimed in claim 1, wherein each TFT is an N-type low temperature poly silicon (LTPS) TFT, the first constant voltage is a constant high voltage, and the second constant voltage is a constant low voltage.

3. The GOA circuit for narrow border LCD panel as claimed in claim 1, wherein each TFT is a P-type LTPS TFT, the first constant voltage is a constant low voltage, and the second constant voltage is a constant high voltage.

4. The GOA circuit for narrow border LCD panel as claimed in claim 1, wherein when applied to a display panel with dual-side progressive scanning architecture, a GOA circuit is disposed on both the left side and the right side of the display panel, the GOA circuit on both sides comprising GOA units of each stage; the GOA unit of each stage on both sides receiving two clock signals: a first clock signal and a second clock signal; the first clock signal and the second clock signal having opposite phases.

5. The GOA circuit for narrow border LCD panel as claimed in claim 4, wherein in the GOA unit of each stage, the first clock signal and the second clock signal alternatingly serve as the output clock signal and the control clock signal, respectively.

6. The GOA circuit for narrow border LCD panel as claimed in claim 4, wherein other than the first stage, the stage-propagated signal for the n-th GOA unit is the output signal of the previous stage GOA unit, ((n−1)-th stage GOA unit); and the stage-propagated signal for the first stage GOA unit is a circuit start signal.

7. The GOA circuit for narrow border LCD panel as claimed in claim 1, wherein when applied to a display panel with dual-side interlaced scanning architecture, a GOA circuit is disposed on both the left side and the right side of the display panel, the GOA circuit on one side comprising only GOA units of odd-numbered stages and the GOA circuit on the other side comprising only GOA units of even-numbered stages;

the GOA unit of each stage on one side receiving two clock signals: a first clock signal and a third clock signal; and the GOA unit of each stage on the other side receiving two clock signals: a second clock signal and a fourth clock signal.

8. The GOA circuit for narrow border LCD panel as claimed in claim 7, wherein the first clock signal, the second clock signal, the third clocks signal and the fourth clock signal have the same pulse cycles; the falling edge of the first clock signal and the rising edge of the second clock signal are generated simultaneously; the falling edge of the second clock signal and the rising edge of the third clock signal are generated simultaneously;

the falling edge of the third clock signal and the rising edge of the fourth clock signal are generated simultaneously; the falling edge of the fourth clock signal and the rising edge of the first clock signal are generated simultaneously.

9. The GOA circuit for narrow border LCD panel as claimed in claim 7 wherein in the GOA unit of each stage on one side, the first clock signal and the third clock signal alternatingly serve as the output clock signal and the control clock signal, respectively; in the GOA unit of each stage on the other side, the second clock signal and the fourth clock signal alternatingly serve as the output clock signal and the control clock signal, respectively.

10. The GOA circuit for narrow border LCD panel as claimed in claim 7, wherein other than the first stage and the second stage, the stage-propagated signal for the n-th GOA unit is the output signal of the second stage earlier than the current stage((n−2)-th stage GOA unit); and the stage-propagated signal for the first stage GOA unit and the second stage GOA unit is the circuit start signal.

11. A gate driver on array (GOA) circuit for liquid crystal display (LCD) panel, which comprises: a plurality of cascade GOA units, with GOA unit each stage comprising: a control input unit, a regulation unit, a control output unit, a pull-down holding unit, a pull-down unit, a second node control unit, and a first node leakage prevention unit;

for a positive integer n, in the GOA unit of the n-th stage:

the control input unit comprising: a first thin film transistor (TFT), with gate connected to a stage-propagated signal, source connected to a first constant voltage, and drain connected to a third node;

the regulation unit comprising: a second TFT, with gate connected to the first constant voltage, source connected to the third node, and drain connected to a first node;

the control output unit comprising: a third TFT, with gate connected to the first node, source connected to an output clock signal, and drain connected to an output end; and a first capacitor, with one end connected to the first node, and the other connected to the output end;

the pull-down holding unit comprising: a fifth TFT, with gate connected to a second node, source connected to the output end, and drain connected to a second constant voltage; and a second capacitor, with one end connected to the second node, and the other connected to the second constant voltage;

the pull-down unit comprising: a sixth TFT, with gate connected to a fourth node, source connected to the third node, and drain to a source of a seventh TFT; and a seventh TFT, with gate connected to the second node, and drain connected to the second constant voltage;

the second node control unit comprising: a fourth TFT, with gate connected to the third node, source connected to the control clock signal, and drain connected to the second node; and an eighth TFT, with gate connected to the control clock signal, source connected to the first constant voltage, and drain connected to the second node;

the first node leakage prevention unit comprising: a ninth TFT, with gate and source connected to the output clock signal, and drain connected to the fourth node; a tenth TFT, with gate connected to the stage-propagated signal, source connected to the fourth node, and drain connected to the second constant voltage; and a third capacitor, with one end connected to the fourth node and the other connected to the second constant voltage;

wherein when applied to a display panel with dual-side progressive scanning architecture, a GOA circuit is disposed on both the left side and the right side of the display panel, the GOA circuit on both sides comprising GOA units of each stage; the GOA unit of each stage on both sides receiving two clock signals: a first clock signal and a second clock signal; the first clock signal and the second clock signal having opposite phases;

wherein in the GOA unit of each stage, the first clock signal and the second clock signal alternatingly serve as the output clock signal and the control clock signal, respectively;

wherein other than the first stage, the stage-propagated signal for the n-th GOA unit is the output signal of the previous stage GOA unit, ((n−1)-th stage GOA unit); and the stage-propagated signal for the first stage GOA unit is a circuit start signal.

12. The GOA circuit for narrow border LCD panel as claimed in claim 11, wherein each TFT is an N-type low temperature poly silicon (LTPS) TFT, the first constant voltage is a constant high voltage, and the second constant voltage is a constant low voltage.

13. The GOA circuit for narrow border LCD panel as claimed in claim 11, wherein each TFT is a P-type LTPS TFT, the first constant voltage is a constant low voltage, and the second constant voltage is a constant high voltage.

* * * * *